US012609271B2

(12) United States Patent
Flatt et al.

(10) Patent No.: US 12,609,271 B2
(45) Date of Patent: Apr. 21, 2026

(54) HIGH VOLTAGE POWER SUPPLIES FOR FAST VOLTAGE CHANGES

(71) Applicant: Advanced Energy Industries, Inc., Denver, CO (US)

(72) Inventors: Arthur Flatt, Fort Collins, CO (US); Gary Byfield, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 428 days.

(21) Appl. No.: 18/488,646

(22) Filed: Oct. 17, 2023

(65) Prior Publication Data

US 2025/0125117 A1      Apr. 17, 2025

(51) Int. Cl.
*H01J 37/24*         (2006.01)
*H01J 37/26*         (2006.01)

(52) U.S. Cl.
CPC .......... *H01J 37/241* (2013.01); *H01J 37/265* (2013.01); *H01J 37/268* (2013.01)

(58) Field of Classification Search
CPC ....... H01J 37/241; H01J 37/265; H01J 37/268
See application file for complete search history.

(56) References Cited

U.S. PATENT DOCUMENTS

| | | | |
|---|---|---|---|
| 4,400,660 A | 8/1983 | Schaefer | |
| 5,623,171 A | 4/1997 | Nakajima | |
| 6,320,319 B1 | 11/2001 | Iwai et al. | |

| | | | |
|---|---|---|---|
| 10,096,705 B2 | 10/2018 | Nielsen et al. | |
| 10,973,112 B2 | 4/2021 | Kadoi et al. | |
| 11,764,033 B2 * | 9/2023 | Byfield | H01J 37/241 |
| | | | 307/52 |

(Continued)

FOREIGN PATENT DOCUMENTS

| | | |
|---|---|---|
| CN | 105356438 A | 2/2016 |
| EP | 1862879 A1 | 12/2007 |
| EP | 2750271 A1 | 7/2014 |
| EP | 3164878 A1 | 5/2017 |
| JP | 2013196324 A | 9/2013 |

OTHER PUBLICATIONS

Pct, International Search Report and Written Opinion issued in PCT/US2024/049799, Dec. 31, 2024, 13 pages.

(Continued)

*Primary Examiner* — Nicole M Ippolito
(74) *Attorney, Agent, or Firm* — NOD Law PC

(57)           ABSTRACT

The disclosure describes a high voltage power supply and control system for electron beam tools. The system includes a primary DC source, one or more secondary regulated sources, and a fast power control interposed therebetween. The fast power control includes a transfer capacitor coupled to ground, a first fast power control, and a second fast power control. The first fast power control makes rapid and small adjustments to the total output provided to the secondaries and hence controls small adjustments to the tool, while the second fast power control makes proportional voltage or current changes of an opposing polarity to charge or discharge the transfer capacitor and thereby maintain charge balance relative to cable capacitances of cables connecting the high voltage power source to the tool. The system can be used with electron beam tools such as scanning electron microscopes, electron beam inspection tools, or electron lithography tools.

18 Claims, 8 Drawing Sheets

(56)            References Cited

U.S. PATENT DOCUMENTS

| | | | | |
|---|---|---|---|---|
| 2003/0117025 A1* | 6/2003 | Rouquette | ............... | G01V 1/22 |
| | | | | 307/147 |
| 2007/0279009 A1 | 12/2007 | Kobayashi | | |
| 2010/0109436 A1 | 5/2010 | Lanni | | |
| 2011/0198511 A1 | 8/2011 | Graupera et al. | | |
| 2013/0194846 A1* | 8/2013 | Taddeo | .................. | H02M 1/10 |
| | | | | 363/123 |
| 2015/0116881 A1 | 4/2015 | Burnett et al. | | |
| 2015/0222115 A1 | 8/2015 | Zhu et al. | | |
| 2016/0336442 A1 | 11/2016 | Nielsen et al. | | |
| 2018/0331582 A1* | 11/2018 | Moffatt | .................. | H02J 50/12 |
| 2022/0246390 A1 | 8/2022 | Byfield et al. | | |
| 2024/0272214 A1* | 8/2024 | Zhang | ............... | G01R 27/2605 |

OTHER PUBLICATIONS

European Patent Office, "Extended European Search Report Regarding Application No. 19184399.4", dated Feb. 3, 2020, p. 10, Published in: EP.

JPO, "Office Action Received in Japanese Patent Application No. 2021-578025", dated Feb. 6, 2023, p. 6, Published in: JP.

Riju Jacob, "International Search Report and Written Opinion Regarding International Application No. PCT/US2020/040803", dated Sep. 2, 2020, p. 16, Published in: AU.

Xiofan Tang, "International Preliminary Report on Patentibility Regarding International Application No. PCT/US2020/040803", dated Jan. 13, 2022, p. 8, Published in: CH.

* cited by examiner

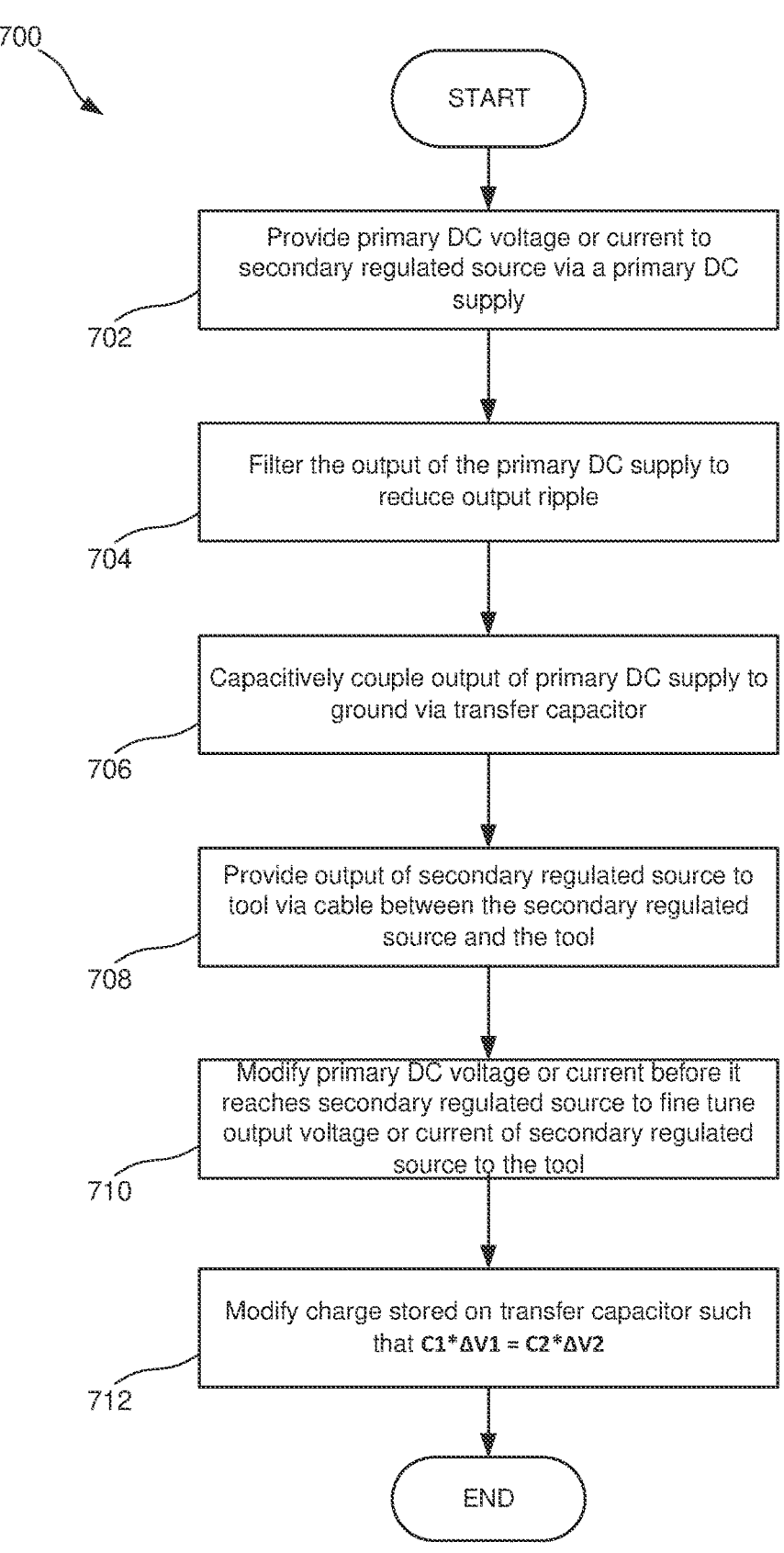

700

START

Provide primary DC voltage or current to secondary regulated source via a primary DC supply

702

Filter the output of the primary DC supply to reduce output ripple

704

Capacitively couple output of primary DC supply to ground via transfer capacitor

706

Provide output of secondary regulated source to tool via cable between the secondary regulated source and the tool

708

Modify primary DC voltage or current before it reaches secondary regulated source to fine tune output voltage or current of secondary regulated source to the tool

710

Modify charge stored on transfer capacitor such that $C1*\Delta V1 = C2*\Delta V2$

712

END

FIG. 7

HIGH VOLTAGE POWER SUPPLIES FOR FAST VOLTAGE CHANGES

REFERENCE TO RELATED APPLICATIONS

The present application is related to U.S. patent application Ser. No. 17/623,687, filed Dec. 29, 2021 and titled "High Voltage Power Supply," which is a national stage entry of WIPO Pat. App. No. PCT/US2020/040803, filed Mar. 7, 2020 and titled "High Voltage Power Supply," claiming priority to European Pat. App. No. 19184399, filed Apr. 7, 2019 and titled "High Voltage Power Supply." All of the above referenced applications are incorporated hereby in their entirety by reference.

FIELD OF THE INVENTION

The present invention relates to high voltage direct current (HVDC) power supplies. In particular, but not by way of limitation, the present invention relates to high voltage power supplies used in a variety of high voltage applications, such as electron beam inspection (EBI), scanning electron microscope (SEM), and lithography.

DESCRIPTION OF RELATED ART

HVDC power supplies suitable for use with EBI, SEM, and lithography applications typically share a common electrical architecture including a primary HVDC power output and one or more secondary HVDC power outputs. Commonly, the primary HVDC power source is known as an accelerator, forming a first stage in an electron supply system, for example, and typically providing a high voltage to, for instance, a suppressor, extractor, and heater. The primary HVDC power output is normally referenced to Earth potential and feeds the secondary HVDC power outputs. The one or more secondary HVDC power outputs are generally floating, or referenced to the output of the accelerator.

A schematic view of an example power supply is illustrated in FIG. 1. A HVDC power source 120 may be used with, for example, electron beam inspection (EBI), scanning electron microscope (SEM), and lithography applications. As shown in FIG. 1, power source 120 includes a primary accelerator 102, a secondary suppressor 103, a secondary extractor 104, and a secondary heater 107. Primary accelerator 102 may act as a primary HVDC power output referenced to Earth potential, feeding the secondary HVDC power outputs. For example, in the embodiment illustrated in FIG. 1, primary accelerator 102 is grounded, while secondary extractor, secondary suppressor, and secondary heater are referenced to a floating ground (i.e., the accelerator 102 output).

Primary accelerator 102 typically includes a variable HVDC power source capable of delivering tens of kilovolts of output voltage (for instance, V1=−30 kilovolts (kV) direct current (DC)). Commonly known as an accelerator, primary accelerator 102 forms the first stage in an electron supply system.

A terminal 108 of primary accelerator 102 is connected with one or more secondary HVDC output power sources so that the secondary HVDC output power sources are all referenced to a common "floating" ground (i.e., terminal 108). In operation, these secondary HVDC output power sources may be "floating" at several tens of kilovolts from Earth potential, for example.

Exemplary floating secondary HVDC output power sources may include, for example, secondary extractor 104 (typically rated to 10 kV DC at 400 microamperes) suitable for controlling the amount and manner in which electrons are extracted from an electron emitter, and a secondary suppressor 103 (typically rated to −1000 V DC at 20 microamperes) suitable for controlling the movement of a cloud of electrons (i.e., charged particles) emitted by the electron emitter. Also present on the secondary supply side may be a low voltage DC output power source, for example, a secondary heater 107 (typically rated to 5 V DC at 3 amperes) suitable for powering the electron emitter source. Each of primary accelerator 102, secondary extractor 104, secondary suppressor 103, and secondary heater 107 may include components such as one or more capacitors and resistors in parallel or in series with voltage or current sources, and the specific combinations shown throughout the figures should not be considered limiting.

As shown in FIG. 1, the combination of primary accelerator 102 and the secondary HVDC output power sources (e.g., secondary extractor 104, secondary suppressor 103, and secondary heater 107) forms the high voltage power source unit (HV PSU) 120 (indicated by a dashed box). Components of HV PSU 120 may be electrically connected with a tool 140 via a plurality of cables 130 (indicated by a dashed box). Tool 140 may include, for example, an electron emitter (sometimes referred to as a heater tip) 142 producing a cloud of electrons which is controlled by suppressor 103 and extractor 104 creating a beam of electrons (generally indicated by a dashed line 144) directed toward a stage 148 supporting a wafer 150 to be inspected.

As EBI, SEM, and lithography tools scan across the wafer 150, the electron beam interacts with structures at different elevations or distances from the electron emitter 142, effectively requiring that the tool 140 change its "focus" as it scans. This focus is controlled via voltage or current applied by the secondaries to the tool 140. Thus, scan speed is in part a function of the HVPS 120 ability to quickly alter the voltage (or current) applied to the tool 140. The accelerator 102 typically sees large filtering, for instance as seen in the RC filter of C1 and R1, which limits the accelerator's 102 bandwidth and precludes the rapid changes in output needed to allow quick scanning of the tool 140. Accordingly, typical high voltage power sources 120 do not keep up with the scanning speed demands placed on modern inspection and lithography tools.

At the same time, even when methods are implemented that make for quicker changes between HVPS 120 outputs, these rapid changes in voltage or current lead to increased capacitive coupling between the cables 130 and ground modeled as capacitances C5, C6, C7, and C8, which together can be referred to as the cable capacitance, $C_C$. This coupling in turn causes a disturbance in the output to the tool 140. As EBI, SEM, and lithography applications require precise voltage or current control of the tool 140 (e.g., to achieve proper 'focus' on micron-sized features on a wafer 150), existing systems have to wait until the secondaries output to the tool 140 settles within an acceptable margin of target values. This settling requirement adds to latency and increases the inspection time for a wafer.

While it may be possible to install capacitors with suitable capacitance to smooth out the voltage disturbances to the floating secondary outputs, such an approach is not practical as the capacitors may create an energy hazard from unintended rapid discharge of the capacitors and may affect the response and settling time of the secondary outputs.

Thus, there is a need for an improved HVDC power source capable of providing rapidly changing voltages and reduced settling times.

SUMMARY OF THE INVENTION

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

A high voltage power supply and control system for electron beam tools includes a primary DC source, one or more secondary regulated sources, and a fast power control interposed therebetween. The fast power control includes a transfer capacitor coupled to ground, a first fast power control, and a second fast power control. The first fast power control makes rapid and small adjustments to the output provided to the secondary regulated sources and hence controls small adjustments to the tool, while the second fast power control makes proportional voltage or current changes of an opposing polarity to charge or discharge the transfer capacitor and thereby maintain charge equality relative to cable capacitances of cables connecting the secondary regulated sources to the tool. The system can be used with electron beam tools such as scanning electron microscopes, electron beam inspection tools, or electron lithography tools, though other tools that receive a high DC voltage or current relative to ground can also implement this disclosure.

In some aspects, the techniques described herein relate to a high voltage power source including: a primary DC source; one or more secondary sources configured to provide regulated voltage or current to one or more loads via one or more cables, that as a set have an effective cable capacitance, CC; a fast power control coupled between the primary DC source and the one or more secondary sources, the fast power control including: a transfer capacitor coupled to ground; a first variable power source arranged between the primary DC source and the one or more secondary sources; a second variable power source arranged between the primary DC source and the transfer capacitor; wherein changes to the first variable power source are primarily configured to effect changes in power delivered to the one or more loads, wherein changes to the second variable power source are primarily configured to equalize charge on the transfer capacitor and the effective cable capacitance, CC.

In some aspects, the techniques described herein relate to an electron beam assembly including: an electron beam tool; one or more cables having an effective capacitance to ground, CC; a primary DC source; one or more secondary regulated sources configured to provide regulated outputs to the electron beam tool via the one or more cables; and a fast power control coupled between the primary DC source and the one or more secondary regulated sources, the fast power control including: a transfer capacitor coupled to ground; a first variable power source arranged between the primary DC source and the one or more secondary regulated sources; a second variable power source arranged between the primary DC source and the transfer capacitor; and a non-transitory tangible computer readable medium with computer readable instructions configured to: cause the first variable power source to adjust a first output to the one or more secondary regulated sources thereby adjusting a focal length of the electron beam tool; and cause the second variable power source to adjust a second output to the transfer capacitor thereby reducing a settling time of the regulated outputs to the electron beam tool.

In some aspects, the techniques described herein relate to a method of driving a tool including: providing, via a primary DC supply, a primary DC signal to a secondary regulated source; filtering an output of the primary DC supply to reduce output ripple; capacitively coupling the output of the primary DC supply to ground via a transfer capacitor having a capacitance, C1 and a voltage, V1; providing an output to the tool via a cable between the secondary regulated source and the tool, the cable having a capacitance, C2 and a voltage, V2; modifying the primary DC signal before it reaches the secondary regulated source to fine tune the output to the tool; and modifying a charge stored on the transfer capacitor such that $C1*\Delta V1 = C2*\Delta V2$.

These and other features, and characteristics of the present technology, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of 'a', 'an', and 'the' include plural referents unless the context clearly dictates otherwise.

BRIEF DESCRIPTION OF DRAWINGS

FIG. 7 illustrates a method of operating an HVDC power source, in accordance with an embodiment.

Figure 1:
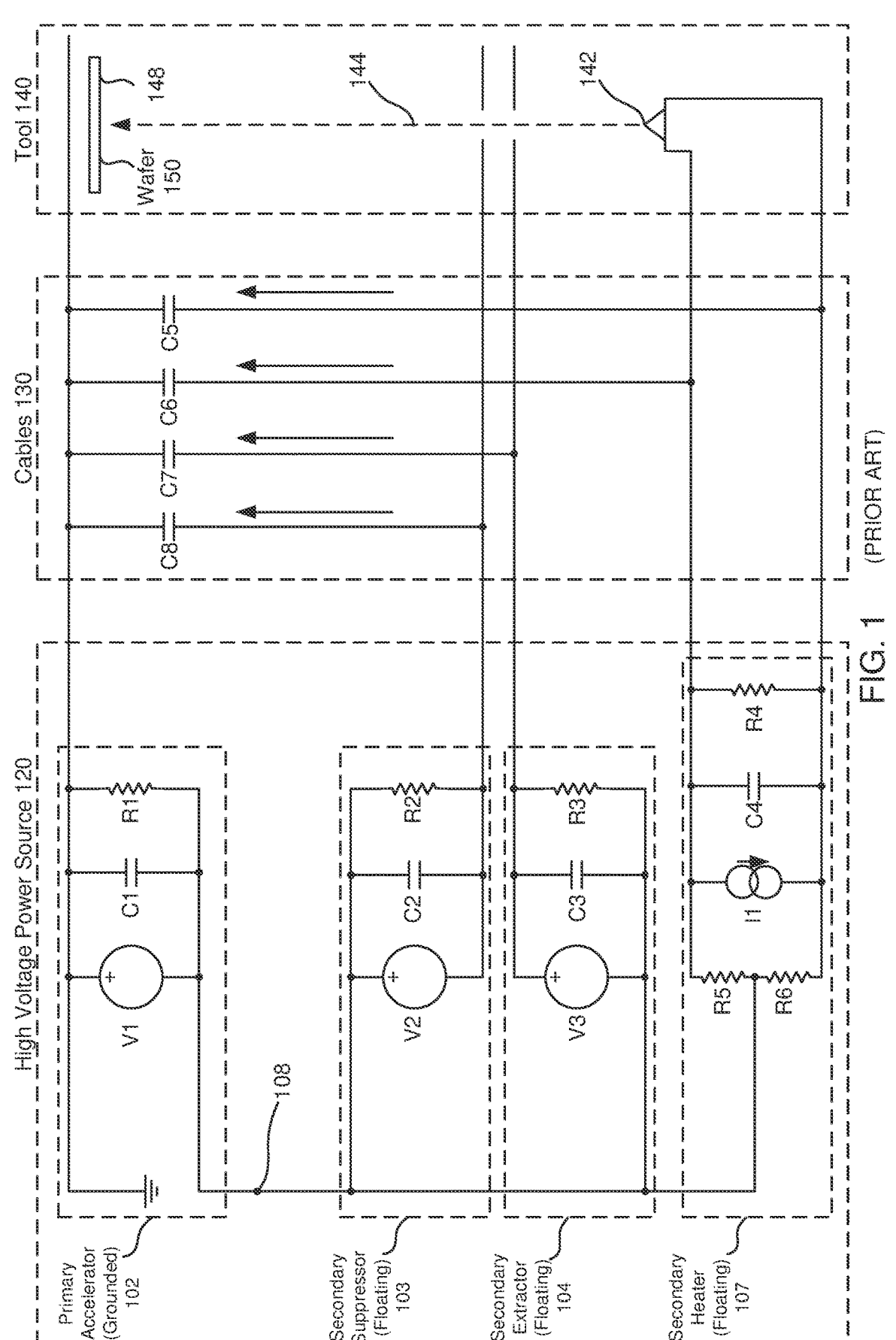
FIG. 1 is a block diagram view of an exemplary HVDC power source coupled to a tool via a plurality of cables.

For simplicity and clarity of illustration, the drawing figures illustrate the general manner of construction, and descriptions and details of well-known features and techniques may be omitted to avoid unnecessarily obscuring the embodiments detailed herein. Additionally, elements in the drawing figures are not necessarily drawn to scale. For example, the dimensions of some of the elements in the figures may be exaggerated relative to other elements to help improve understanding of the described embodiments. The same reference numerals in different figures denote the same elements.

The word "exemplary" is used herein to mean "serving as an example, instance, or illustration." Any embodiment described herein as "exemplary" is not necessarily to be construed as preferred or advantageous over other embodiments. In the following detailed description, references are made to the accompanying drawings that form a part hereof, and in which are shown by way of illustrations or specific examples. These aspects may be combined, other aspects may be utilized, and structural changes may be made without departing from the present disclosure. Example aspects may be practiced as methods, systems, or apparatuses. The following detailed description is therefore not to be taken in a limiting sense, and the scope of the present disclosure is defined by the appended claims and their equivalents.

DETAILED DESCRIPTION OF THE INVENTION

The present disclosure describes embodiments of a HVDC power supply and related supply method having advantages over known such supplies and methods. In particular, the invention seeks to provide for a HVDC power supply and related supply method which can address problems in the current art without exhibiting at least one of the limitations noted above.

For example, when inspecting a wafer using an EBI system, the wafer under inspection is bombarded at the tool (e.g., tool 140 in FIG. 1) by a stream of electrons emitted from the heater tip (e.g., electron emitter 142), which operates at negative voltage at tens of kilovolts below Earth potential. Secondary extractor 104 and secondary suppressor 103 may adjust and control the electron cloud emitted from electron emitter 142. Electrons reach wafer 150, secondary electrons and backscattered electrons may be gathered to provide information at a molecular level about the structure of the wafer 150 (e.g., to see 3D structures on the micron level).

During the scan process, changes in voltage at the heater tip with respect to Earth allow the tool 140 to track the topology of the wafer under inspection. In order to speed up the scan process, the voltage changes at the heater tip should occur within a short time frame (e.g., tens of microseconds), and the resulting stabilization or settling time at all scan positions and thus all secondary outputs should be within hundreds of microseconds. This requirement is difficult to satisfy, as the capacitances of the interposed cables (e.g., cables 130) may interfere with the achievement of a well-behaved voltage change (i.e., there may be transients). In other words, the cable 130 capacitances, $C_C$, may lead to slower settling of the output voltages, which prevents the tool 140 from taking a measurement until sufficient settling has occurred.

It is also recognized that primary accelerator 102 generally has a limited bandwidth of at most 10 Hz, due to the slow output filter required to minimize switching ripple (e.g., C1 and R1). Further, the accelerator 102 output is generally in one quadrant, meaning primary accelerator 102 is typically limited to sinking current. Consequently, simple modulation of the output of primary accelerator 102 is not effective in providing the relatively fast changes in voltage required at the heater tip 142 in various types of tools 140.

Figure 2:
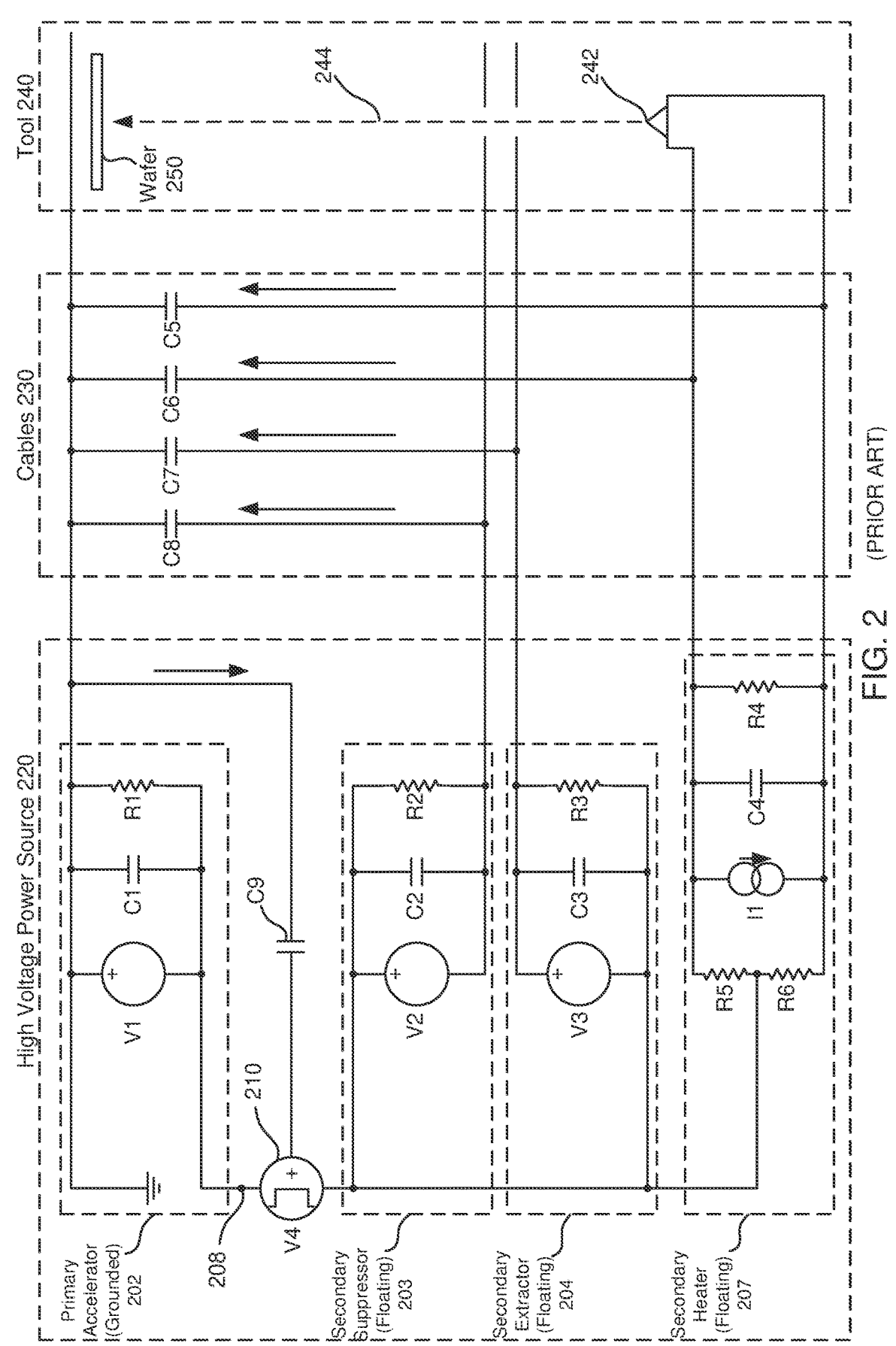
FIG. 2 is a block diagram view of an HVDC power source including a fast voltage control (FVC) configuration, in accordance with an embodiment.

One solution to these issues is to add a fast voltage control (FVC) component 210 as a secondary variable voltage source to the HV PSU 220 as a floating secondary component, for instance, to the output of the accelerator 202 as shown in FIG. 2. A transfer capacitor, C9, is also added electrically in series to the cable capacitances, $C_C$, and the FVC 210 can then add to or subtract from the accelerator 202 output by means of charge or discharge the transfer capacitor, C9, to null by balancing the capacitive effects of the cables 230.

The FVC component 210 may function to impose small and rapid changes of voltage at heater tip 242 with respect to ground/earth that are not possible via the highly filtered accelerator 202. This change in voltage effects changes in 'focus', for instance, to accommodate the change in geometry of structures on a wafer 250 as the scan moves across the wafer 250 and/or to provide charge reversal/equalization at the wafer 250, at discrete times during the wafer 250 inspection process. At the same time, internals of the FVC 210 (e.g., resistor and capacitor values) can be adjusted during manufacturing to help match charge across the transfer capacitor, C9, to charge on the cable capacitances, $C_C$. However, in the field, these components are much more difficult to modify, and thus such a system can typically be optimized for a single set of cables 230.

Figure 3:
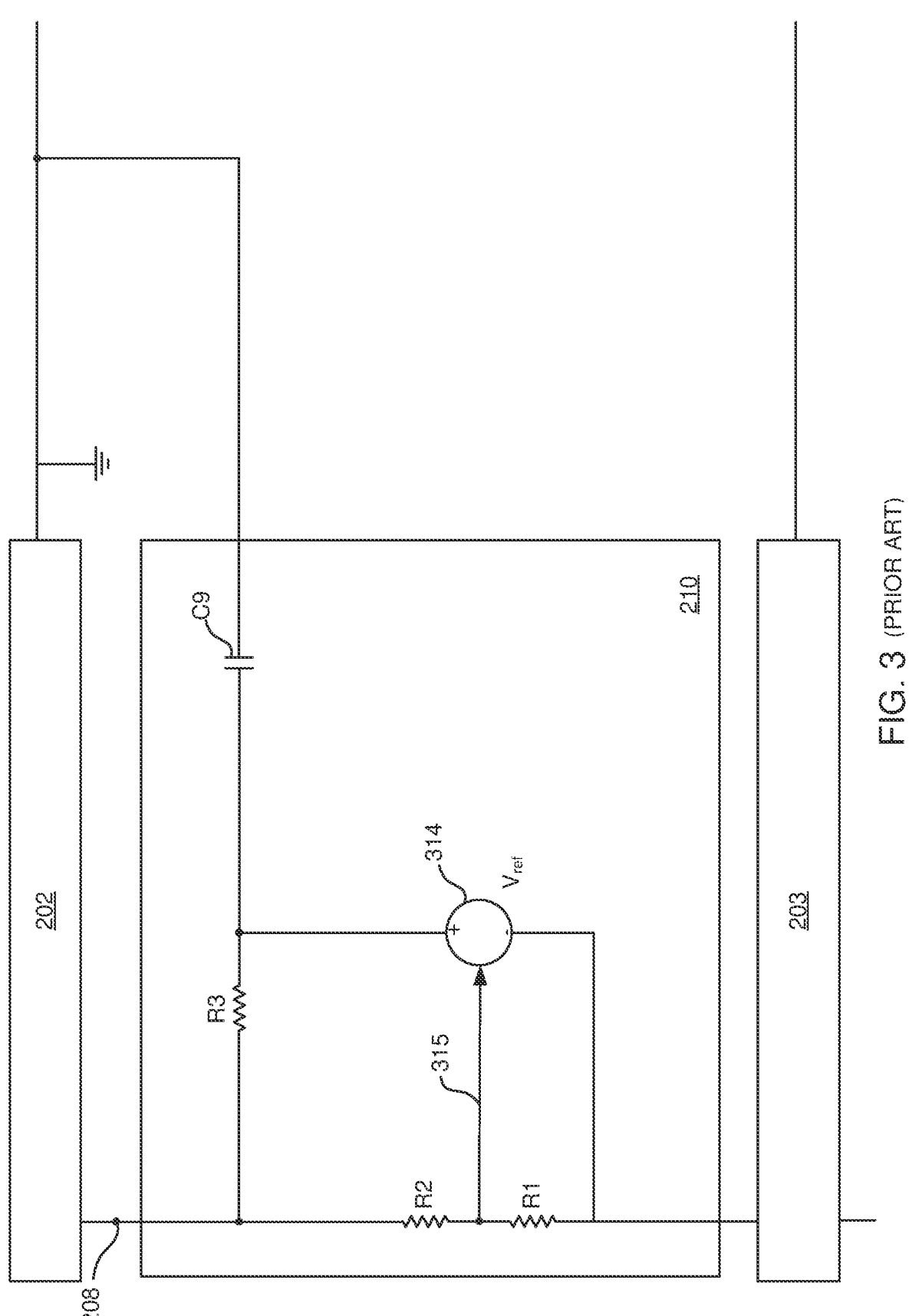
FIG. 3 is a schematic view illustration of a fast voltage control, such as the one illustrated in FIG. 2.

FIG. 3 provides a detailed view of internal components of an FVC component 210. A variable DC source 314 having a voltage is coupled between resistors, R1, R2, and R3. These resistors R1, R2, and R3 form a potential divider across the variable DC source 314, this resistor network providing feedback 315 to enable the voltage of the variable DC source 314 to be regulated. Resistors R1 and R2 provide a voltage divider that measures the voltage between the accelerator output 208 and the other secondary components (e.g., 203) noting that the total voltage applied to the output is the combination of the regulated voltage across R1 and R2 added to the voltage produced by accelerator 202. Resistor R3 sets the voltage between the accelerator output 208 and the transfer capacitor C9. Varying the variable DC source 314 not only sets the output between the accelerator output 208 and the other secondary components (e.g., 203), but also the voltage between the accelerator output 208 and the transfer capacitor C9 in direct proportion, since resistors R1, R2, R3 are in series. By adjusting the resistor values, the FVC component 210 can be designed to achieve charge equalization between C9 and the cable capacitances, $C_C$. In other words, R1, R2, and R3, can be selected such that $\Delta V1*C9=\Delta V2*C_C$, where V1 is the voltage across the transfer capacitor, C9, and V2 is the voltage between cables and ground, for various operating parameters of the system.

Returning to FIG. 2, since the FVC component 210 can both source and sink current, the overall HVPS 220 also has this same ability.

While the approach illustrated in FIGS. 2 and 3 may provide faster voltage changes at the cables connecting the HVPS to the tool compared to the approach illustrated in FIG. 1, the actual voltage change at the tool is still affected by slow output stabilization to the tool 240 as well as intolerance to changes in the cables 230. Additionally, the solution of FIGS. 2 and 3 are tailored for a given one or more cables and convenient/rapid changes to adapt to alternative cables is not possible. The components R1, R2, R3 that determine the balance of the cables are embedded in the high voltage power source, and field adjustment or change is not practical.

As an alternative, multiple sources may be implemented to counteract or null the effect of current fluctuations in the high voltage cables and overall system during process voltage changes, thus significantly reducing the voltage change effect and the settling time between voltage changes. Such an approach may help to increase scanning speeds.

In an embodiment, multiple power sources may be used between the accelerator and the secondary sources, to allow optimization for different circuit constraints, such as cable type, cable length, and cable number. This approach may, for example, use the capacitance of the connecting cables together with a transfer capacitor to provide optimal charge balancing between the transfer capacitor and the cable capacitances as well as faster settling of the secondary outputs. It may also enable optimal tailoring of the HVPS to different system constraints such as cable capacitance, cable length, and number of cables.

Figure 4:
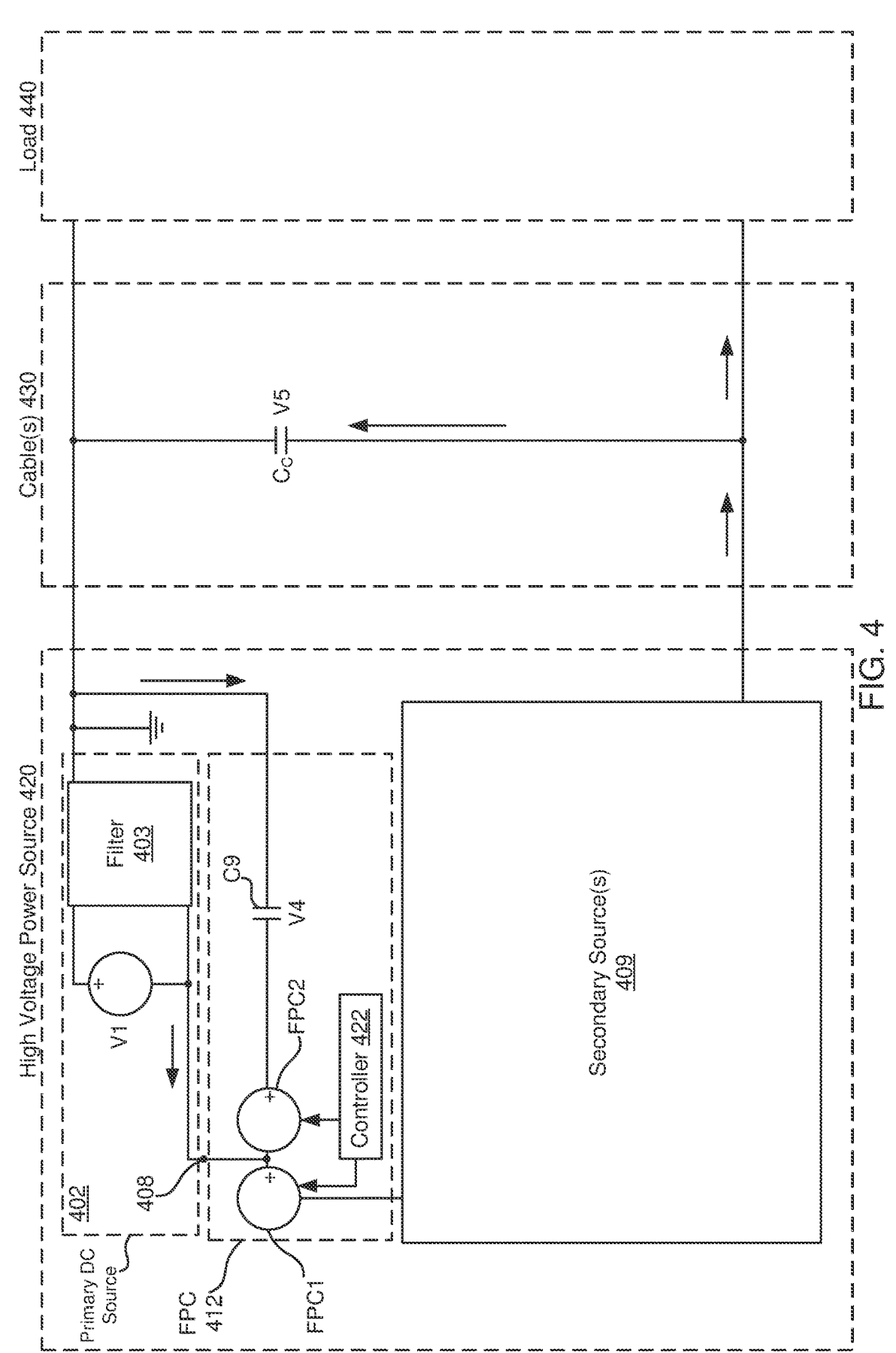
FIG. 4 is a block diagram view of another HVDC power source including a fast power control configuration having two fast power control modules therein, in accordance with an embodiment.

FIG. 4 shows a HVPS having a fast power control (FPC) with two power sources: a first variable power source (FPC1) and a second variable power source (FPC2). The first and second variable power source, FPC1 and FPC2. The combination of the first and second fast power controls enables shorter settling time and thus faster voltage change implementation over using the single FVC alone seen in FIGS. 1-3, regardless of the cables used for coupling to the load. The high voltage power source 420 includes a primary DC source 402 that is referenced to ground and can provide large voltages or currents, such as −10 kV. The high voltage power source 420 may also include one or more secondary sources 409 configured to receive an output from the primary DC source 402 and provide one or more regulated voltages or currents to a load 440 via one or more cables 430. The one or more cables 430 can experience capacitive coupling to ground, where a sum of the capacitances of the one or more cables 430 can be referred to as effective capacitance, $C_C$. The cables 430 can reside at a voltage, V5, referenced to Earth ground. The primary DC source 402 may include a variable DC supply providing a voltage, V1, often a very large negative voltage such as −10 kV. To avoid unwanted ripple, the output can be filtered, for instance, via a filter 403. The filter 403 can comprise a combination of resistive and capacitive components in one embodiment. However, the filter 403 limits the primary DC source's 402 bandwidth and makes it difficult to apply the HVPS 420 where an output to the load 440 is to be rapidly adjusted. The primary DC source 430 can have an output terminal 408 that the fast power control 412 couples to, thereby providing a floating "ground" reference for the fast power control 412.

Inclusion of a fast power control FPC 412 having a first variable power source, FPC1, and a second variable power source, FPC2, allows the HVPS 420 to more exactly adjust the secondary source(s) 409 output to the load 440. A high voltage transfer capacitor C9, seeing a voltage V4 to ground, can also be a component of the FPC 412 and is arranged between the second variable power source, FPC2, and ground. The second variable power source, FPC2, is arranged between the transfer capacitor, C9, and the primary DC source 402. The first variable power source, FPC1, can be arranged between the primary DC source 402 and the one or more secondary sources 409. In other words, an output of the primary DC source 402 can be arranged between the first and second fast variable power sources. With the primary DC source 402 providing a reference voltage, such as V1 (e.g., −10 kV), changes to the first variable power source, FPC1, are primarily configured to effect rapid changes in potential (by means of voltage or current sources) delivered to the one or more loads 440 via the secondary source(s) 409 and the cable(s) 430, and changes to the second variable power source, FPC2, are primarily configured to equalize changes in charge of the transfer capacitor, C9 with the change in charge of the effective cable capacitance, $C_C$. Said another way, the first variable power source, FPC1, primarily aids in fast voltage or current switching, whereas the second variable power source, FPC2, primarily aids in minimizing settling time to the desired voltage or current targeted by the combination of the primary DC source 402 and the first variable power source, FPC1. Said yet another way, the second variable power source, FPC2, provides a signal (e.g., voltage) selected to provide an optimum response time of a changing signal in the cables 430 to achieve a desired process parameter (e.g., voltage) at the tool 440, where the desired process parameter is controlled by a signal generated by the first variable power source, FPC1, modulated atop the signal from the primary DC source 402. More particularly, for a given FPC1 signal, X, FPC2 is set to provide a second signal, Y, as:

$$Y = X \times \frac{C_C}{C9} \qquad \text{[Eq. 1]}$$

Thus, as FPC1 is increased, for instance, FPC2 will also increase, proportional to the ratio of effective cable capacitance $C_c$ over the transfer capacitance, C9. To achieve these complimentary functions, the first and second variable power sources, FPC1 and FPC2, have opposing polarities with respect to the primary DC source 402.

Controller 422 can provide demand inputs to control the first and second variable power sources, FPC1 and FPC2, and more specifically to maintain the relationship of Equation 1 between outputs of the second variable power source FPC2 and the first variable power source FPC1. The ratio represented by Equation 1 can be stored within memory or analogue circuitry of the controller 422, which can be an FPGA or other programmable controller, in some implementations.

Figure 5:
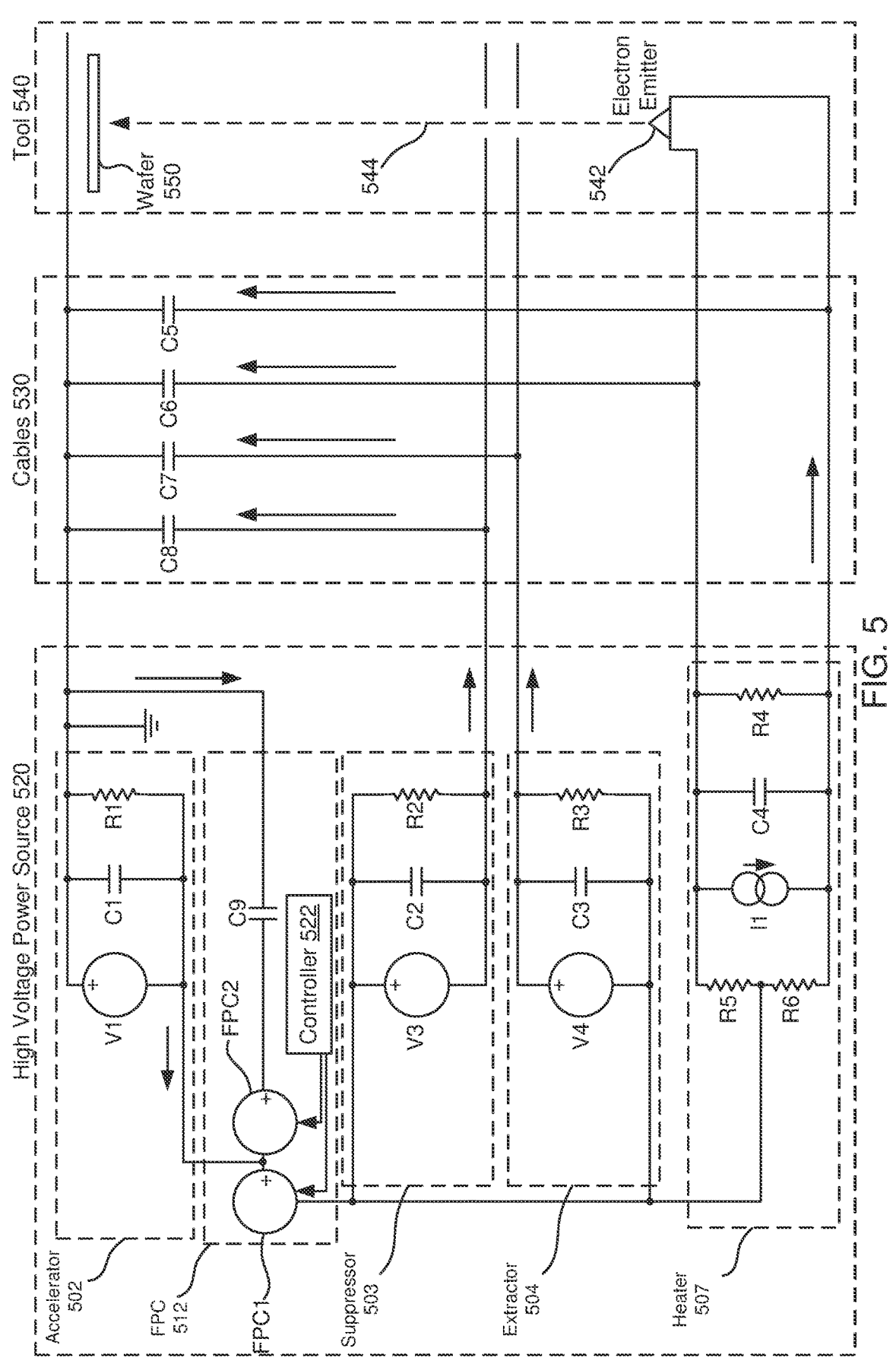
FIG. 5 is a block diagram view of an HVDC power source illustrating additional possible details, in accordance with an embodiment.

The generalized system shown and described relative to FIG. 4 can be implemented in various applications including SEM, EBI, and electron lithography applications. For instance, FIG. 5 illustrates an embodiment where the system of FIG. 4 is applied to a tool, such as a scanning electron microscope or electron lithography tool.

As in FIG. 4, an HVPS 520 provides outputs of one or more secondary sources to a tool 540 via cables 530. In this example, the tool 540 is an SEM, EBI, or electron lithography device using an electron emitter 542 to provide electrons that are targeted at a wafer 550. The secondaries can include a heater 507, an extractor 504, and a suppressor 503. A heater 507 provides a voltage across the electron emitter 542 to allow electron emission, and a suppressor 503 and extractor 504 are configured to adjust the electron cloud 544 en route to the wafer 550 target. A primary accelerator 502 provides a large negative voltage, such as −10 k or −30 kv, which is filtered by C1 and R1, and has an output provided to a fast power control 512 having a first variable power source, FPC1, and a second variable power source, FPC2. The first variable power source, FPC1, is interposed between the output of the primary accelerator 502 and the secondaries and provides adjustments to the combined output provided to the secondaries thereby controlling voltage and current at the electron emitter 542 as well as controls on the electron beam path. The second variable power source, FPC2, is interposed between the output of the primary accelerator 502 and a transfer capacitor, C9, coupled to ground. The cable capacitances, C5, C6, C7, and C9 can be considered as a summed effective capacitance, $C_C$. The second fast power control, FPC2, has an opposing polarity to the first variable power source, FPC1, and is configured to maintain charge equality between the transfer capacitor, C9, and the effective capacitance, $C_C$. In other words, as the first variable power source, FPC1, adjusts power to change the 'focus' of the tool 540, the second variable power source, FPC2, creates an opposing voltage or current sufficient to counterbalance charge that is stored on the cables 530 (i.e., C5, C6, C7, C9) as a result of the change from the first variable power source, FPC1. Equation 2 shows the maintenance of charge equality in mathematical terms:

$$\Delta V(C9) * C9 = -\Delta V(C5, C6, C7, C8) * (C5 + C6 + C7 + C8) \quad \text{[Eq. 2]}$$

Where the change in charge on the transfer capacitor, C9, is shown on the left side, and is equal to an opposing polarity change in charge on the cables on the right side of Equation 1.

The suppressor 503 and the extractor 504 can both include a variable voltage source providing V3 and V4, respectively, as well as a combination of other components such as resistors R2 and R3 and capacitors C2 and C3. The heater 507 can include a pair of resistors R5 and R6, a current source 11, and other components such as a resistor, R4, and a capacitor, C4.

As a numerical example, each of cable capacitances C5-C8 may be of equal value at 1000 pF, thus resulting in a total capacitance of 4000 pF for the four cables. If the capacitance of the transfer capacitor, $C_C$, is 3000 pF and a 500V transition at cables C5-C8 (as controlled by the first variable power source, FPC1) is desired, then C9 should be controlled by second variable power source, FPC2, 552 to provide a voltage change of $\Delta V(C9)$=(500V*4000 pF)/ (3000 pF)=667V in a polarity opposite to that seen at the cable capacitances, $C_C$ (opposite to the polarity of the signal from the first variable power source, FPC1).

Controller 522 can provide demand inputs to control the first and second variable power sources, FPC1 and FPC2, and more specifically to maintain the relationship of Equation 1 between outputs of the second variable power source FPC2 and the first variable power source FPC1. The ratio represented by Equation 1 can be stored within memory or analogue circuitry of the controller 522, which can be an FPGA or other programmable controller, in some implementations.

FIG. 5 represents just one illustration of the many ways that the system in FIG. 4 can be implemented. Other loads 440 than the tool 540 shown in FIG. 5 may be used, and other secondary sources 409 besides a suppressor 503, extractor 504, and heater 507 can be used. And although the primary DC source 402 is shown as an accelerator 502 in FIG. 5 with a source providing V1 and an RC filter comprising C1 and R1, other topologies can also be implemented to achieve alternative primary DC sources. However, it should be noted that a primary DC source having limited bandwidth, for instance, because of a filter such as the one shown in FIG. 5, partially creates a situation where the solution of the fast power control 412 and 512 are most beneficial. In other words, a primary source DC with wide bandwidth and the ability to quickly adjust an output to the load 440, may not benefit as greatly from the solution herein disclosed.

Figure 6:
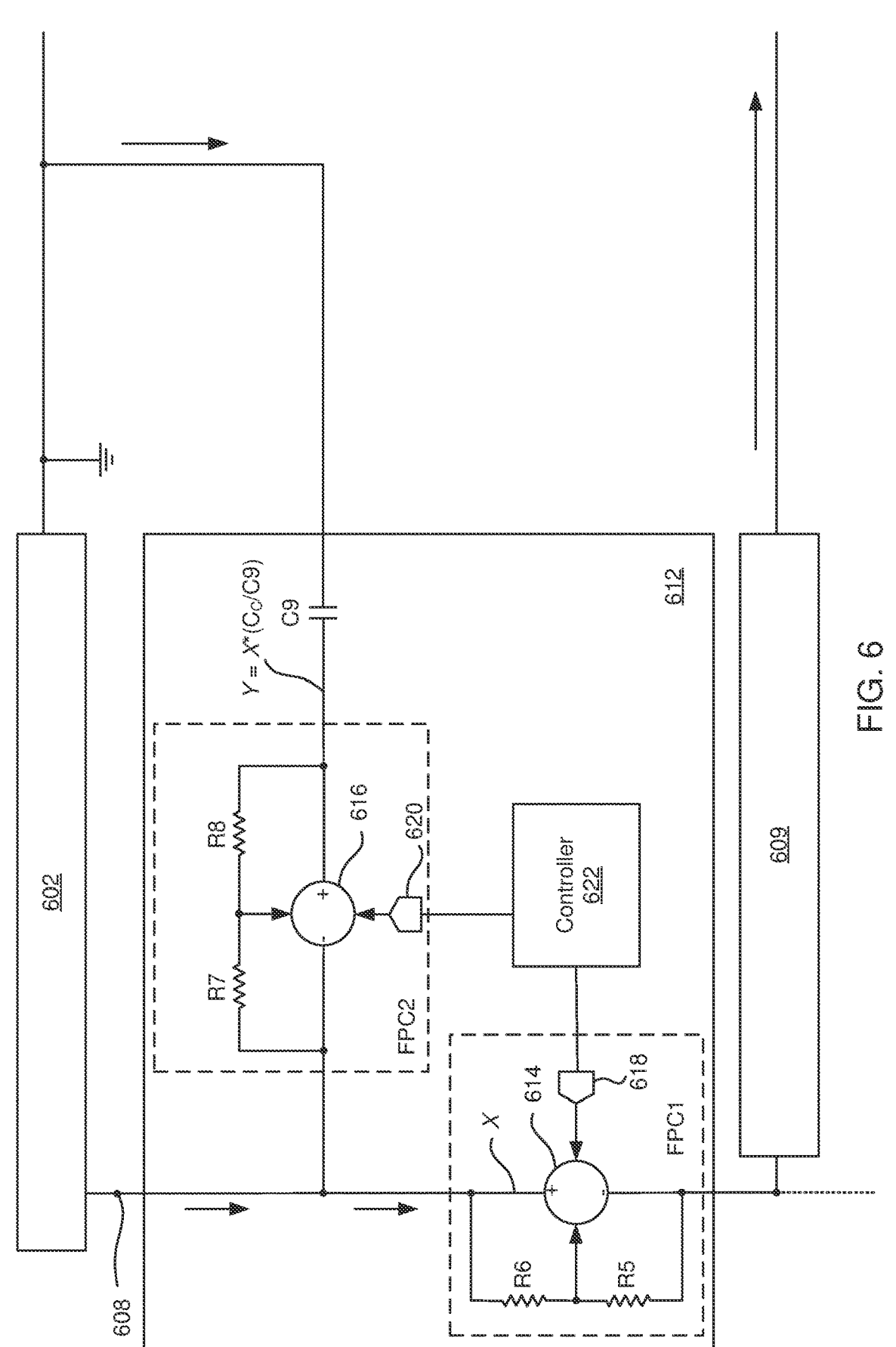
FIG. 6 is a schematic view illustration of a fast power control, such as the one illustrated in FIGS. 4 and 5.

FIG. 6 illustrates an embodiment of the FPC 412 and 512 seen in FIGS. 4 and 5 including feedback loops for the first and second variable power sources, FPC1 and FPC2. A primary DC source 602, referenced to ground, provides a primary DC current and/or voltage as a reference to the FPC 612, having a first variable power source, FPC1 and a second variable power source FPC2. The first variable power source FPC1 modulates this primary DC current and/or voltage with a higher frequency, but much lower amplitude signal, and the combined signal is passed from an output of the FPC 612 to one or more secondary sources 609. The one or more secondary sources 609 provide additional regulation of the combined signal before passing it to a load (not shown) such as, but not limited to, an SEM tool, via one or more cables (not shown). Those cables can add a disturbance to this output that delays settling of the output signal to the target. The second FPC2 in combination with a transfer capacitor C9 achieves charge equality between the transfer capacitor C9 and cable capacitances to ground (termed $C_C$) of the one or more cables. Thus, while the first variable power source FPC1 modulates the voltage and/or current delivered to the load, as well as adds the ability to sink current (which the primary DC source 602 cannot perform alone), the second variable power source FPC2 adjusts charge on the transfer capacitor C9 to mitigate disturbances in the secondary source(s) 609 outputs allowing faster settling to a target output to the load. The first variable power source FPC1 and second variable power source FPC2 have opposing polarities relative to the primary DC source 602.

A controller 622 can manage control inputs to the first and second sources 614 and 616. In particular, the controller 622 provides a demand input 618 to the first source 614 and provides a demand input 620 to the second source 616 to both modulate signals to the load from the one or more secondary sources 609 and to maintain charge equality between the transfer capacitor C9 and the cable capacitances $C_c$. More specifically, the controller 622 provides demand input 618 to the first source 614 to set the magnitude and polarity of a desired change in output between the reference to the FPC 612 (i.e., the primary DC source output 608) and the one or more secondary sources 609. Further, the controller 622 provides demand input 620 to the second source 616 to set the magnitude and polarity of voltage or current applied to the transfer capacitor C9. These two demand inputs 618 and 620 are proportional to the ratio of $C_C$ over C9 as indicated in Equation 1. More specifically, the controller 622 seeks to provide a signal X (e.g., current or voltage) from the first source 614 and hence from the first variable power source FPC1, and a signal Y (e.g., current or voltage) from the source 616 and hence from the second variable power source FPC2, such that X and Y are related according to Equation 1.

Although various feedback mechanisms can be implemented to achieve the relationship of Equation 1, FIG. 6 gives one example where pairs of resistors in parallel to the sources 614 and 616 are used to achieve more accurate outputs. In particular, The first resistor R5 and the second resistor R6 are arranged in series with each other and in parallel to a first signal path through the first source 614, thereby providing a feedback path to the first source 614. This topology is given as an example of achieving the given demand voltage, and does not limit or exclude other topologies for achieving the same effect within the broader disclosure of FIGS. 4-5.

The second variable power source FPC2 includes third resistor, R7, and fourth resistor, R8, this pair of resistors arranged in series between the reference to the FPC 612 (i.e., the primary DC source output 608) and the transfer capacitor C9. The resistors, R7 and R8, are also arranged in parallel to a signal path through the second source 616. The input demands to the first variable power source, FPC1 and the second variable power source, FPC2, are set by relative magnitudes of the associated capacitances C9 and $C_c$, and more specifically, according to the ratio set forth in Equation 1. In other words, controller 622 applies input demands 618 and 620 to the first and second sources 614, 616 to maintain a ratio of $C_c$/C9 between the second source 616 and the first source 614, and the two resistor networks are selected to ensure that this goal is achieved to an acceptable tolerance level.

This example is provided for first and second sources 614 and 616 acting as voltage sources. Were current sources used instead, then small series-sensing resistors could be used as the feedback mechanism, in one non-limiting example.

It is recognized herein that an immediately apparent solution to implementing a voltage change at the heater tip, or other loads, may be to interpose a voltage source directly between the accelerator and heater tip or other load. However, the presence of cable capacitances connecting the HV PSU with the tool or load (e.g., between tool 140 and HV PSU 120 of FIG. 1 or HV PSU 220 of FIG. 2) means this single voltage source approach is difficult to optimize or adapt to changes in cable capacitances. By incorporating multiple sources as described herein, the embodiments herein yield additional benefits not available in previous systems such as, but not limited to, accommodating the capacitive effects of high voltage cables, reducing the recovery time to induced voltage changes, enabling optimization and/or calibration of the power system for the specific high voltage cable capacitance and performance requirements of the tool used with the HV PSU, and reducing the risk of wafer and equipment damage due to electrostatic discharge (ESD) by ready application of voltage changes to disperse charge build-up at the wafer.

FIG. 7 illustrates a method of driving a tool, such as an electron beam tool. The method 700 can apply to any tool having a high voltage and grounded side, such as any tool having an electron emitter and a grounded plate or support opposing the electron emitter with a capacitive load. A scanning electron microscope and a vacuum tube (e.g., EL34) are just non-limiting two examples. One or more additional regulated loads may exist between these two extremes, such as, but not limited to, a suppressor, extractor, grid, screen, etc.

The method 700 can include providing a primary DC signal (e.g., voltage or current) to a secondary regulated source via a primary DC supply (Block 702). The method 700 can further include filtering the output of the primary DC supply to reduce output ripple (Block 704), which in many cases means that the primary DC supply has limited bandwidth and may not be able to make rapid adjustments to the tool as may be required in certain implementations such as, but not limited to, electron beam lithography and scanning electron microscopy. The method 700 can further include capacitively coupling the output of the primary DC supply to ground via a transfer capacitor having a capacitance, C1 and a voltage, V1 (Block 706). The method 700 may further include providing an output to the tool via a cable between the secondary regulated source and the tool, the cable having a capacitance, C2 and a voltage, V2 (Block 708). The method 700 may further include modify the primary DC signal before it reaches the secondary regulated source to fine tune the output to the tool (Block 710). However, these modifications to a target output may be hampered or delayed by latency in settling to the target output caused by the capacitance, C2, of the cable. To mitigate the destabilizing effects of this capacitance, the method 700 may further include modifying a charge stored on the transfer capacitor such that $C1*\Delta V1=C2*\Delta V2$– charge equalization between the transfer capacitor and the cable capacitance (Block 712).

Figure 8:
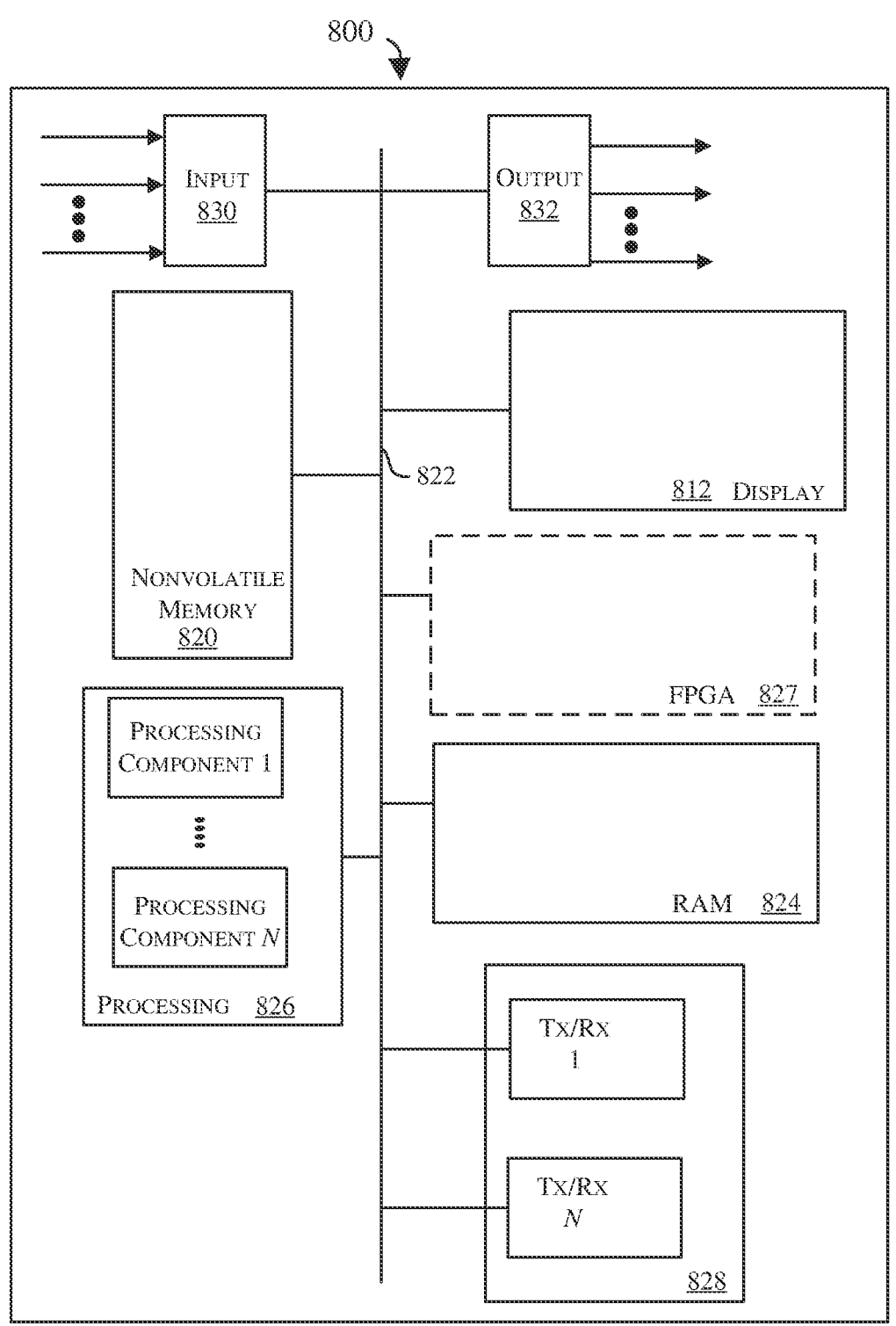
FIG. 8 illustrates an exemplary computing system for carrying out one or more embodiments of the disclosure.

The methods described in connection with the embodiments disclosed herein may be embodied directly in hardware, in processor-executable code encoded in a non-transitory tangible processor readable storage medium, or in a combination of the two. Referring to FIG. 8 for example, shown is a block diagram depicting physical components that may be utilized to realize the fast power control 412, 512, 612, the high voltage power source 420 and 520 or the entire assembly shown in FIGS. 4, 5, and/or 6, according to an exemplary embodiment. As shown, in this embodiment an optional display portion 812 can be coupled to a bus 822, and nonvolatile memory 820 can be coupled to the bus 822. The bus 822 can also be coupled to random access memory ("RAM") 824, a processing portion (which includes N processing components) 826, an optional field programmable gate array (FPGA) 827, and a transceiver component 828 that includes N transceivers. Although the components depicted in FIG. 8 represent physical components, FIG. 8 is not intended to be a detailed hardware diagram; thus many of the components depicted in FIG. 8 may be realized by common constructs or distributed among additional physical components. Moreover, it is contemplated that other existing and yet-to-be developed physical components and architectures may be utilized to implement the functional components described with reference to FIG. 8.

In general, the nonvolatile memory 820 is non-transitory memory that functions to store (e.g., persistently store) data and processor-executable code (including executable code that is associated with effectuating the methods described herein). In some embodiments for example, the nonvolatile memory 820 includes bootloader code, operating system code, file system code, and non-transitory processor-executable code to facilitate the execution of a method described with reference to FIG. 7 described further herein.

In many implementations, the nonvolatile memory 820 is realized by flash memory (e.g., NAND or ONENAND memory), but it is contemplated that other memory types may be utilized as well. Although it may be possible to execute the code from the nonvolatile memory 820, the executable code in the nonvolatile memory is typically loaded into RAM 824 and executed by one or more of the N processing components in the processing portion 826.

The optional display portion 812 generally operates to provide a user interface for a user, and in several implementations, the display is realized by a touchscreen display. In some embodiments, the optional display portion 812 is configured to receive cable characteristics representative of the one or more cables (e.g., 430, 530, 630) being used in a given system. In this way, the cables can be changed, and the high voltage power source can be updated with information characterizing this change, thereby allowing the fast power control, FPC, and more specifically, the second fast power control, FPC2, to adjust charges on the transfer capacitor configured to achieve charge balancing as the first variable power source, FPC1, alters the output to the tool via the cables.

The N processing components in connection with RAM 824 generally operate to execute the instructions stored in nonvolatile memory 820 to enable control of the fast power control, FPC, and more specifically, the first and second variable power sources, FPC1 and FPC2. For example, non-transitory, processor-executable code to effectuate the methods described with reference to FIG. 7 may be persistently stored in nonvolatile memory 820 and executed by the N processing components in connection with RAM 824. As one of ordinarily skill in the art will appreciate, the processing portion 826 may include a digital signal processor (DSP), micro-controller, graphics processing unit (GPU), or other hardware processing components or combinations of hardware and software processing components (e.g., an FPGA or an FPGA including digital logic processing portions).

In addition, or in the alternative, the processing portion 826 may be configured to effectuate one or more aspects of the methodologies described herein (e.g., the method described with reference to FIG. 7). For example, non-transitory processor-readable instructions may be stored in the nonvolatile memory 820 or in RAM 824 and when executed on the processing portion 826, cause the processing portion 826 to perform a method of driving a tool (i.e., equalizing charge between a transfer capacitor and cable capacitances in response to modulation of one or more regulated outputs to the tool, such as to an electron emitter, an extractor, and a suppressor of an electron beam tool). Alternatively, non-transitory FPGA-configuration-instructions may be persistently stored in nonvolatile memory 820 and accessed by the processing portion 826 (e.g., during boot up) to configure the hardware-configurable portions of the processing portion 826 to effectuate the functions of the fast power control 412, 512, 612, or the high voltage power source 420 and 520 or the entire assembly shown in FIGS. 4, 5, and/or 6.

The input component 830 operates to receive signals (e.g., an indication of cable(s) characteristics such as cable capacitance or feedback measured between FPC2 and transfer capacitor C9) that are indicative of one or more aspects of the cable(s) and/or charge on the transfer capacitor C9. The signals received at the input component may include, for example, feedback concerning current or voltage applied to or on the transfer capacitor C9. The output component generally operates to provide one or more analog or digital signals to effectuate an operational aspect of the fast power control 412, 512, 612, or the high voltage power source 420 and 520, or the entire assembly shown in FIGS. 4, 5, and/or 6. For example, the output portion 832 may provide the output from the FPC2 to the transfer capacitor C9 described with reference to FIGS. 4-6.

The depicted transceiver component 828 includes N transceiver chains, which may be used for communicating with external devices via wireless or wireline networks. Each of the N transceiver chains may represent a transceiver associated with a particular communication scheme (e.g., WiFi, Ethernet, Profibus, etc.). For instance, a user may enter a cable identifier, which can then be used to extract further cable characteristics from a remote server or the Internet.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

The terms and expressions employed herein are used as terms and expressions of description and not of limitation, and there is no intention, in the use of such terms and expressions, of excluding any equivalents of the features shown and described or portions thereof. Each of the various elements disclosed herein may be achieved in a variety of manners. This disclosure should be understood to encompass each such variation, be it a variation of an embodiment of any apparatus embodiment, a method or process embodiment, or even merely a variation of any element of these. Particularly, it should be understood that the words for each element may be expressed by equivalent apparatus terms or method terms-even if only the function or result is the same. Such equivalent, broader, or even more generic terms should be considered to be encompassed in the description of each element or action. Such terms can be substituted where desired to make explicit the implicitly broad coverage to which this invention is entitled.

As but one example, it should be understood that all action may be expressed as a means for taking that action or as an element which causes that action. Similarly, each physical element disclosed should be understood to encompass a disclosure of the action which that physical element facilitates. Regarding this last aspect, by way of example only, the disclosure of a "protrusion" should be understood to encompass disclosure of the act of "protruding"—whether explicitly discussed or not—and, conversely, were there only disclosure of the act of "protruding", such a disclosure should be understood to encompass disclosure of a "protrusion". Such changes and alternative terms are to be understood to be explicitly included in the description.

The invention claimed is:

1. A high voltage power source comprising:
a primary DC source;
one or more secondary sources configured to provide regulated voltage or current to one or more loads via one or more cables, that as a set have an effective cable capacitance, $C_C$; and a fast power control coupled between the primary DC source and the one or more secondary sources, the fast power control comprising:

a transfer capacitor coupled to ground;

a first variable power source arranged between the primary DC source and the one or more secondary sources; and a second variable power source arranged between the primary DC source and the transfer capacitor;

wherein changes to the first variable power source are primarily configured to effect changes in power delivered to the one or more loads, wherein changes to the second variable power source are primarily configured to equalize charge on the transfer capacitor and the effective cable capacitance, $C_C$.

2. The high voltage power source of claim 1, wherein the first and second variable power sources have opposing polarities.

3. The high voltage power source of claim 1, wherein a voltage or current applied to the one or more loads is proportional to a sum of voltages or currents from the primary DC source and the first variable power source.

4. The high voltage power source of claim 1, wherein the load is a scanning electron microscope, electron beam inspection tool, or electron lithography tool.

5. The high voltage power source of claim 4, wherein the one or more secondary regulated sources comprise a suppressor, an extractor, and a heater.

6. The high voltage power source of claim 1, wherein changes to the second variable power source are configured to accommodate different cables and their effective cable capacitance, $C_C$.

7. The high voltage power source of claim 1, wherein the first variable power source is configured to control focus of an electron beam tool.

8. An electron beam assembly comprising:

an electron beam tool;

one or more cables having an effective capacitance to ground, $C_C$;

a primary DC source;

one or more secondary regulated sources configured to provide regulated outputs to the electron beam tool via the one or more cables; and a fast power control coupled between the primary DC source and the one or more secondary regulated sources, the fast power control comprising:

a transfer capacitor coupled to ground;

a first variable power source arranged between the primary DC source and the one or more secondary regulated sources;

a second variable power source arranged between the primary DC source and the transfer capacitor; and a non-transitory tangible computer readable medium with computer readable instructions configured to:

cause the first variable power source to adjust a first output to the one or more secondary regulated sources; and cause the second variable power source to adjust a second output to the transfer capacitor.

9. The electron beam assembly of claim 8, wherein the non-transitory tangible computer readable medium is further configured to cause the second variable power source to adjust the second output to equalize charge between the (1) transfer capacitor and (2) different sets of the one or more cables.

10. The electron beam assembly of claim 8, wherein the primary DC source includes a filter that limits its bandwidth.

11. The electron beam assembly of claim 8, wherein the first variable power source and the second variable power source have opposing polarities.

12. The electron beam assembly of claim 8, wherein to adjust the second output to the transfer capacitor reduces a settling time of the regulated outputs to the electron beam tool.

13. A method of driving a tool comprising:

providing, via a primary DC supply, a primary DC signal to a secondary regulated source;

filtering an output of the primary DC supply to reduce output ripple;

capacitively coupling the output of the primary DC supply to ground via a transfer capacitor having a capacitance, $C1$ and a voltage, $V1$;

providing an output to the tool via a cable between the secondary regulated source and the tool, the cable having a capacitance, $C2$ and a voltage, $V2$;

modifying the primary DC signal before it reaches the secondary regulated source to fine tune the output to the tool; and modifying a charge stored on the transfer capacitor such that $C1*\Delta V1 = C2*\Delta V2$.

14. The method of claim 13, wherein the primary DC supply sinks current and wherein the modifying the primary DC signal comprises sourcing current.

15. The method of claim 13, wherein the tool is a scanning electron microscope.

16. The method of claim 13, wherein the tool comprises an electron emitter and a suppressor.

17. The method of claim 13, wherein the modifying the charge stored on the transfer capacitor reduces a settling time of the output voltage or current to a target value.

18. The method of claim 13, wherein the modifying the charge stored on the transfer capacitor comprises selecting a signal provided to the transfer capacitor, that as a ratio to a signal provided to the secondary regulated source, is $C1/C2$.

* * * * *